(12) United States Patent
Robinson et al.

(10) Patent No.: US 6,475,028 B1
(45) Date of Patent: Nov. 5, 2002

(54) METER SOCKET ADAPTER WITH CONNECTIONS TO ELECTRICAL COMPONENT IN AN ENCLOSURE

(75) Inventors: Darrell Robinson, Highland Township, MI (US); Allen V. Pruehs, Howell, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 09/544,995

(22) Filed: Apr. 6, 2000

(51) Int. Cl.[7] ............................................. H01R 33/945
(52) U.S. Cl. ..................... 439/517; 439/135; 439/463; 439/709; 439/718
(58) Field of Search ................................ 439/135, 465, 439/718, 709, 719, 463, 464, 517

(56) References Cited

U.S. PATENT DOCUMENTS

| | | | |
|---|---|---|---|
| 5,041,009 A | * 8/1991 | McCleerey | .................. 439/405 |
| 5,207,595 A | 5/1993 | Learmont et al. | |
| RE34,531 E | * 2/1994 | Bell et al. | .................... 439/135 |
| D349,689 S | 8/1994 | Robinson et al. | |
| 5,571,031 A | 11/1996 | Robinson et al. | |
| 5,577,933 A | 11/1996 | Robinson et al. | |
| 5,586,913 A | 12/1996 | Robinson et al. | |
| 5,595,506 A | 1/1997 | Robinson et al. | |
| 5,704,804 A | 1/1998 | Robinson et al. | |
| 5,762,522 A | 6/1998 | Robinson et al. | |
| 5,853,300 A | 12/1998 | Robinson et al. | |

OTHER PUBLICATIONS

2100 Series Polyphase A to S Adapters, Ekstrom Industries, Inc., Bulletin EI–2100–791–1M.

* cited by examiner

*Primary Examiner*—Tho D. Ta
*Assistant Examiner*—Truc Nguyen
(74) *Attorney, Agent, or Firm*—Young & Basile, PC

(57) ABSTRACT

A meter socket mountable in an enclosure and receiving blade terminals of a watthour meter in electrical contact with jaws mounted in the meter socket has an open end allowing electrical conductors connected at one end to each of the jaws in the meter socket to exit the housing of the meter socket for connection to a remotely located meter test switch. The conductors are arranged in a plurality of separate tied bundles. Each of the conductors may be uniquely color coded for easy connection to the appropriate meter test switch terminal.

20 Claims, 4 Drawing Sheets

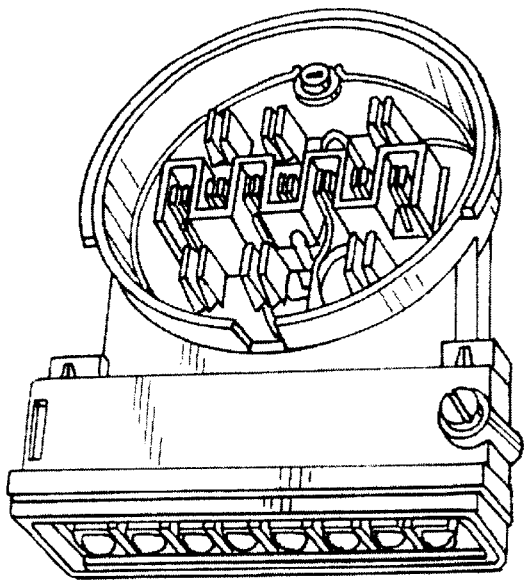
FIG. 2
PRIOR ART
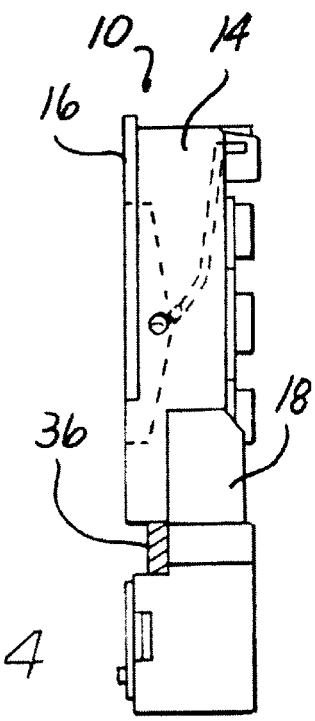
FIG. 4
| SHELL POS# | WIRE COLOR | GA. | GROUP |
|---|---|---|---|
| 1 | RED | 12 | A |
| 2 | BLACK | 12 | A |
| 3 | GREEN | 12 | B |
| 4 | ORANGE | 12 | B |
| 9 | WHITE | 12 | A |
| 10 | BLUE | 12 | A |
| 11 | RED/BLACK TRACE | 12 | A |
| 12 | WHITE/BLACK TRACE | 12 | A |
| 13 | GREEN/BLACK TRACE | 12 | A |
| 14 | RED | 16 | A |
| 15 | YELLOW | 16 | B |
| 16 | BLACK | 16 | B |
| 17 | BLACK/WHITE TRACE | 12 | B |
FIG. 7

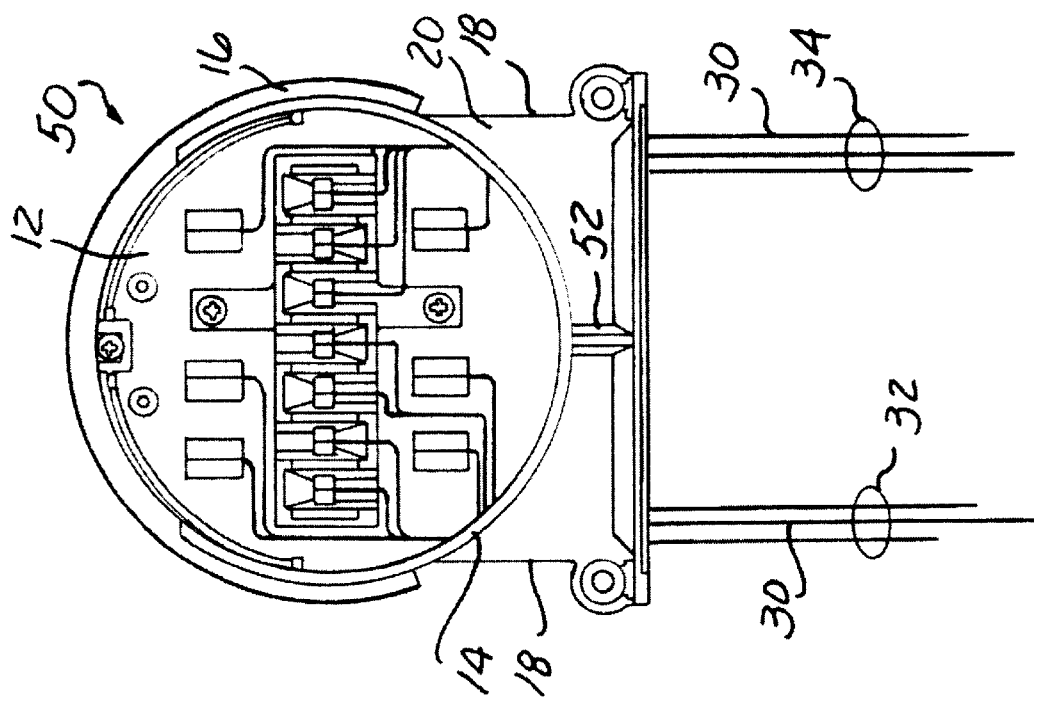
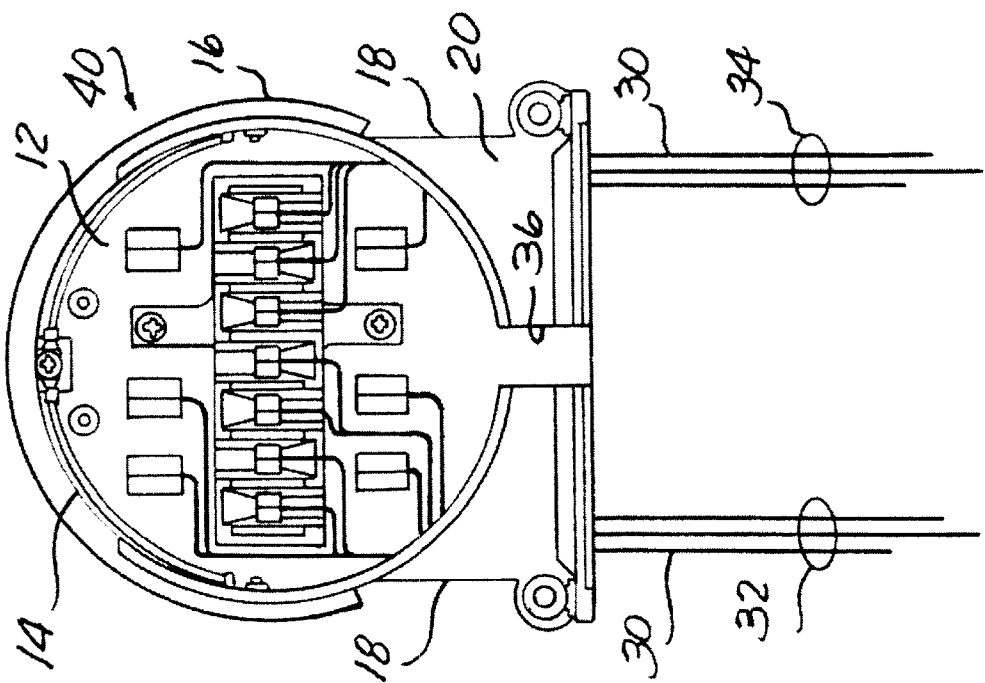
FIG. 6
FIG. 5

METER SOCKET ADAPTER WITH CONNECTIONS TO ELECTRICAL COMPONENT IN AN ENCLOSURE

BACKGROUND OF THE INVENTION

1. Field of the Invention

The present invention relates, in general, to watthour meters and, more specifically, to watthour meter sockets mounted in enclosures.

2. Description of the Related Art

Power disconnect switches are used in a number of applications, such as utility watthour meter, relay, instrument transducer and control system calibration, disconnecting, troubleshooting and testing.

In the electric utility application, watthour meters are commonly employed to measure electrical power consumption at a residential or commercial establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts in the socket receive blade terminals on a plug-in watthour meter to complete an electric circuit through the meter between the line and load terminals in the cabinet for the measurement of electrical power consumption.

Current transformer or CT rated watthour meters and socket adapters are employed in high current applications. In such an application, current transformers are coupled to the line and load conductors and have their output leads connected to terminals in a current transformer or CT rated watthour meter socket adapter. A low current rated watthour meter is then plugged into the socket adapter or socket to measure consumed at the building site.

In addition, potential coils in a watthour meter may also be connected by potential blade terminals to potential blade contacts mounted in the socket or socket adapter and connected by individual conductors to terminals mounted in the terminal portion of the socket adapter.

However, with current transformer rated socket adapters or sockets, it is necessary to short circuit the line and load terminals when the watthour meter is removed from the socket for replacement or testing. Heretofore, test switch devices have been incorporated into the CT rated socket to provide the necessary short circuit or bypass feature.

Exemplary test switches are made by Meter Devices Company, Inc., of Canton, Ohio. Such test switches are typically mounted in a watthour meter socket immediately below a watthour meter or watthour meter/socket adapter. The test switches are generally in the form of single throw, knife-type switches which are provided in multiples ganged together into one assembly; but each electrically connected between one line contact and one load contact in the socket. Once an optional socket cover is removed, the test switches can be operated as desired to provide the necessary bypass connection between the line and load contacts and conductors prior to removing the watthour meter from the socket for testing, recalibration, replacement, etc.

However, wiring connections are required to be made between the bottom mounted terminals on a typical watthour meter socket, such as the watthour meter socket adapter shown in U.S. Pat. No. 5,853,300, and assigned to the assignee of the present invention, and the individual terminals on the meter test switches. The two terminals between each jaw contact and each meter test switch introduce a voltage drop and a resulting power drop in the watthour meter circuitry. In addition, the extra wiring connections and conductors add cost to the watthour meter/meter test switch assembly.

The voltage drop across the terminal block connections also causes the loss of metered power. In the current circuits where a current transformer is employed, the extra terminal connections place a larger load on the current transformer which must then work harder. This effects the accuracy of the current transformer output and may require larger diameter or gauge conductors between the current transformer and the line and load terminals in the watthour meter socket.

In an attempt to address these disadvantages, Ekstrom Industries, Inc., has previously sold a pre-wired meter socket and test switch assembly including a meter socket with internal mounted meter jaws which is mounted on a planar plate. The meter test switch assembly was also mounted on the plate immediately below the jaw portion of the meter socket. Conductors from the individual jaw contacts were connected directly to the meter test switch terminals thereby eliminating at least one set of terminal blocks and the wires and associated labor required therefore.

However, this apparatus us difficult to use since the one-piece assembly is bulky and difficult to ship. Further, the utility company is required to use the meter test switch and meter socket shipped by the manufacturer. This results in duplicate parts since the utility frequently had its own supply of meter test switches or a meter test switch was already mounted in a particular socket enclosure.

Thus, it would be desirable to provide a meter socket usable with a meter test switch apparatus which overcomes the difficulties encountered with the use of previously devised meter socket and meter test switch combinations.

An additional problem exists in previously devised bottom mounted meter sockets since the annular mounting rim surrounding the socket jaws and to which the watthour meter mounting flange mounts blocks any egress for additional wires or conductors from the socket jaw area to external circuits or devices. This is becoming an ever increasing problem due to advances in watthour meter socket construction, automatic meter reading, etc., which entail the use of data cables and telephone cables extending out of the watthour meter which must be run through the meter socket to suitable connections with external data and telephone devices. In the prior combined watthour meter socket and test switch assembly manufactured by Ekstrom Industries, Inc. not only is the socket adapter mounting rim in the way of any easy routing of the data and telephone cables; but, the meter test switches and meter test switch terminals are also in the way of any convenient cable routing path.

One solution to this problem is shown in FIG. 7 of U.S. Pat. No. 5,857,300, wherein sufficient space has been provided between the jaw contacts to allow for the passage of external conductors through the interior of the meter socket or meter socket adapter. Another prior art solution to the routing of data and telephone cables from a watthour meter through a meter socket or meter socket adapter employs a breakout notch in the bottom portion of the socket adapter mounting rim. The notch can be broken out to allow passage of data and telephone cables from the back of a watthour meter mounted on the socket adapter through the notch and to external circuits or devices. However, the location of the notch in the bottom portion of the meter mounting rim requires a tight bend in the cables to clear the rim filler on the socket. In addition, the cables passing through the notch are still disposed external of the meter socket.

Thus, it would also be desirable to provide a meter socket which overcomes the deficiencies of previously devised meter sockets or socket adapters with respect to the provision of a convenient location for passage of cables from a watthour meter through the socket.

SUMMARY OF THE INVENTION

The present invention is a meter socket for mounting in an enclosure and connectable to a meter test switch remotely located from the meter socket.

In one aspect of the invention, the meter socket includes a housing having a base and a sidewall extending from the base. The sidewall has a generally annular mounting flange extending radially outward from one end of at least a portion of the sidewall, the mounting flange adapted for interconnection with a mating mounting flange on a watthour meter. Jaws are mounted in the base of the housing for receiving blade terminals of a watthour meter. Electrical conductors are disposed with one end in the housing connected to one of the jaws. The electrical conductors extend externally of the housing to another end adapted for connection to a remotely located meter test switch device.

In one aspect of the invention, the conductors extend from the housing in at least one and preferably two separate individually tied together groups or bundles to facilitate routing of the conductors to the meter test switch.

In another aspect, the conductors have unique exterior color coding to identify each specific conductor to facilitate connection to the appropriate meter test switch terminals.

The housing includes a filler extending between lower walls projecting from a portion of the annular sidewall of the housing. In one aspect of the invention, the filler includes a aperture which extends through the filler and an adjacent portion of the annular sidewall of the housing. This aperture facilitates the passage of electrical cable or conductors extending from a watthour meter through the socket housing when the watthour meter is mounted on the mounting flange of the housing.

The meter socket of the present invention provides two unique solutions to the use of previously devised meter sockets and meter test switch combinations. Providing the meter socket housing with an open end enables the conductors connected to each of the individual jaws in the socket housing to extend through the open end of the housing and routed to a connection at an opposite end to terminals on a remotely located meter test switch. This enables the meter socket of the present invention to be easily used with existing meter test switch assemblies or with any meter test switch assembly selected by a utility. The conductors extending between the meter test switch and the meter socket may be easily routed in any configuration. Arranging the conductors in at least one and preferably two tied together groups or bundles facilitates the easy routing of the electrical conductors between the meter socket and the meter test switch assembly.

An aperture may be formed in the meter socket housing and adjacent portion of the annular sidewall on the housing to facilitate the passage of data and telephone cable or other electrical conductors extending outward from a watthour meter through the socket housing without sharp bends. The enables such cable or conductors to be easily passed through the socket housing without damage and, further, easily connected to externally located devices or circuits.

Finally, the provision of unique color coded insulated jackets on each of the conductors facilitates the connection of the conductors to the appropriate terminal on the meter test switch assembly.

BRIEF DESCRIPTION OF THE DRAWINGS

The various features, advantages and other uses of the present invention will become more apparent by referring to the following detailed description and drawing in which:

FIG. 2 is a perspective view of a prior art adapter with a cable breakout notch;

FIG. 4 is a side elevational view of the meter socket shown in FIG. 3;

FIG. 5 is a front elevational view of another aspect of a meter socket according to the present invention;

FIG. 6 is a front elevational view of yet another aspect of a meter socket according to the present invention; and FIG. 7 is a chart depicting color coded conductors used in the embodiment of FIGS. 3–5.

DESCRIPTION OF THE PREFERRED EMBODIMENTS

Before describing the meter socket of the present invention, it will be understood that the meter socket is intended to be used with a meter test switch apparatus, such as that shown in co-pending application Ser. No. 60/146,681, filed Aug. 2, 1999, and entitled Meter Test Switch. Reference may be had to this application for a detailed explanation of the construction and operation of a typical meter test switch which may be employed with the meter socket of the present invention. The entire contents of this application are incorporated herein by reference. It will be further understood that the conductors or wires extending from the meter socket of the present invention, as described hereafter, are connectable to the various terminals on a meter test switch in a conventional manner.

Figure 1:
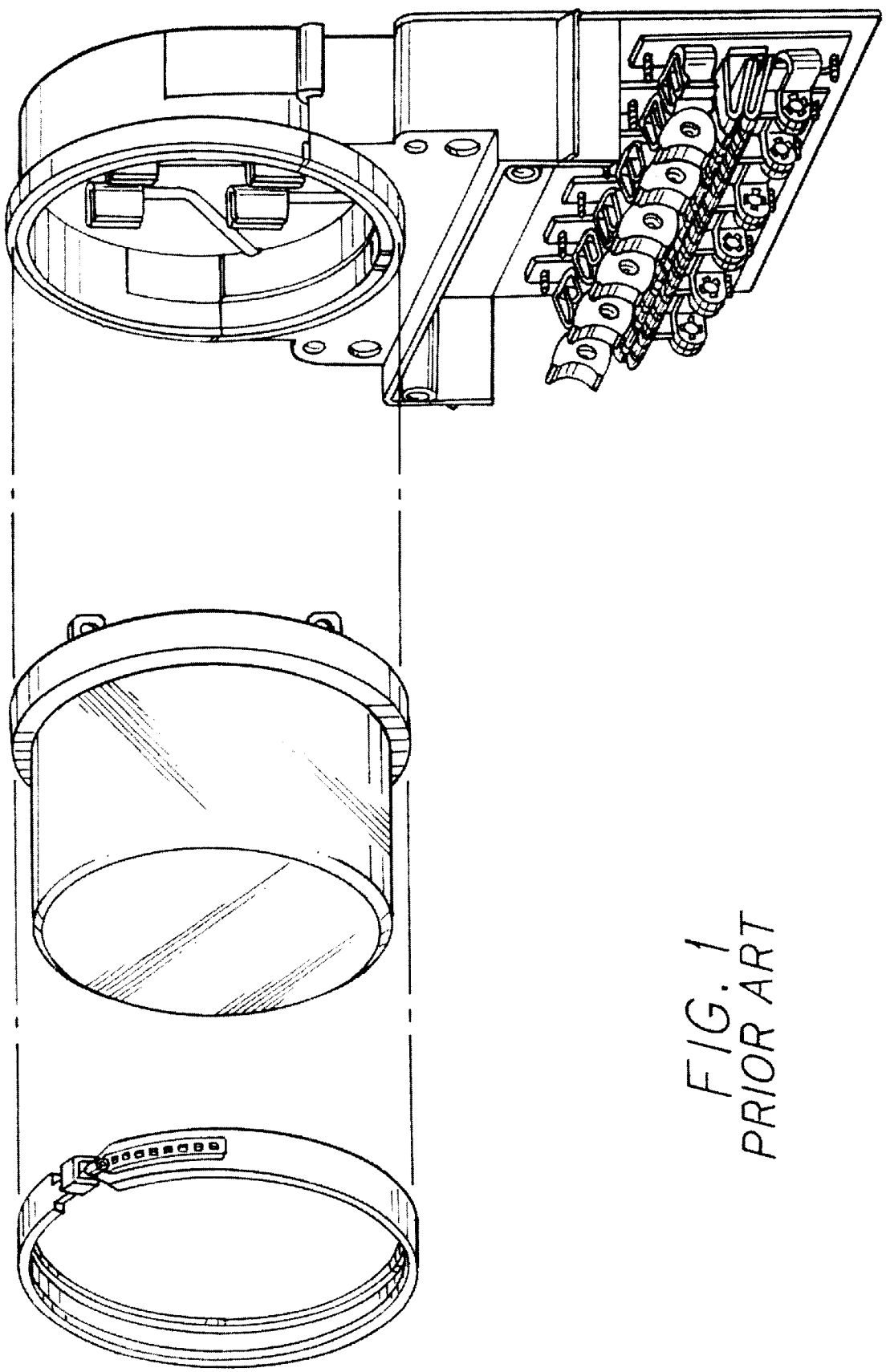
FIG. 1 is a partially exploded, perspective view of a prior art socket adapter and meter test switch assembly.
Figure 3:
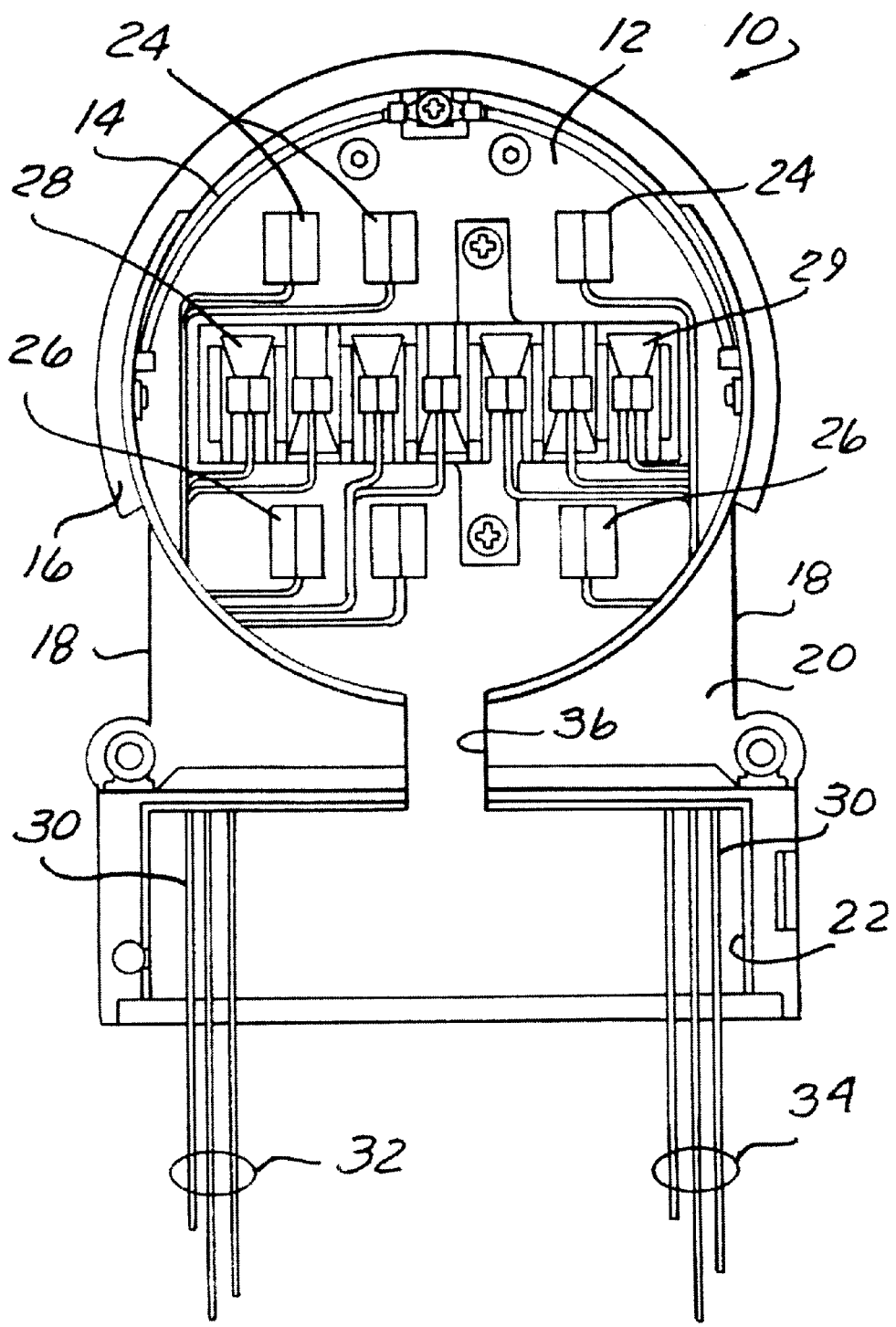
FIG. 3 is a front elevational view of a meter socket according to one aspect of the present invention.

Referring now to the drawing, and to FIGS. 3 and 4 in particular, there is depicted a meter socket or meter socket adapter 10, both hereafter referred to as a "meter socket", which is mountable in an enclosure or housing, not shown, and which is adapted for receiving blade terminals of a watthour meter, as shown in FIG. 1.

As is conventional, and explained in greater detail in U.S. Pat. No. 5,853,300, the entire contents of which are incorporated herein by reference, the meter socket 10 is formed of a suitable electrically insulating material having a base or back wall 12 and an annular sidewall 14 of generally circular configuration projecting outward therefrom. An annular mounting flange 16 projects radially outward from the outer edge of the annular sidewall 14 and serves as a mounting service for a similar mounting flange on a watthour meter.

A pair of lower walls 18 project from the annular sidewall 14 along a lower portion of the back wall 12. A filler 20 extends over the outer ends of lower walls 18 from a bottom portion of the sidewall 14. An opening 22 is formed between opposed portions of the lower walls 18. The opening 22 would normally provide access to a terminal mounting block mounted on a lower portion of the back wall 12 and serving to provide interconnection between conductors extending from various jaw contacts within the meter socket 10 and external connections, such as to a meter test switch, the utility and distribution network line and load conductors, etc. A terminal block cover, not shown, is normally mounted over the opening 22 to cover and provide authorized access to the terminals disposed within the lower walls 18 and the base wall 12.

As is further conventional, and as shown in FIG. 3, a plurality of line and load jaws or jaw contacts. FIG. 3 depicts a three phase meter socket 10 in which the three individual phase line conductors are connected to the line jaws 24 and the three single phase load conductors are connected to the load jaws 26. Also mounted on the back wall 12 are a plurality of terminals for connection to potential or current jaws on a watthour meter. Due to the three phase exemplary construction of the meter socket 10, two potential jaws 28 are provided for each phase along with one ground jaw, 28 and 29.

As shown in FIG. 3, individual conductors 30 are connected to each jaw 24, 26, 28 and 29 at one end and would normally, in a conventional meter socket or meter socket adapter, be connected to an individual terminal mounted in the opening 22 in the lower portion of the meter socket 10.

However, according to this invention, the individual conductors 30 are provided in a length sufficient to enable the conductors 30 to pass through the opening 22 in the lower portion of the meter socket 10 and be connected within an outer surrounding enclosure or housing to a separately located meter test switch, such as that shown in the incorporated pending application for a meter test switch. The outer ends of each conductor 30 may be provided with any type of end connection, such as eyelets, or terminals, bare ends, etc.

According to a unique aspect of the present invention, and as shown in FIG. 3, the conductors 30 are bundled into two groups 32 and 34. This bundling, which can be provided by conventional tie wraps or other bundling clips or fasteners, simplifies the routing of the conductors 30 to the remotely located meter test switch.

According to yet another aspect of the present invention, as shown in FIG. 7, the individual conductors 30 are color coded with respect to a specific jaw mounting position on the back wall 12. The numbers 1–17 shown in FIG. 7 in each jaw are not to be confused with the reference numbers depicting various components of the meter socket 10. Rather, the individual numbers 1–17 on the jaws 24, 26, and 28 depict the conventional jaw mounting position in a meter socket.

By way of example, the color coding chart shown in FIG. 7 references each conductor 30 by its shell or meter socket 10 mounting jaw position. Each conductor 30 is provided with a different color insulating jacket. Conductors corresponding to jaw positions 1 and 14 and 2 and 16 have identical colors. However, the conductors 30 connected to the jaws 1 and 2 have a larger diameter cross section thereby enabling them to be distinguished from the smaller gauge size of the conductors connected to the current jaws 14 and 15. The color coding of the individual conductors 30 facilitates and simplifies the connection of the conductors 30 to the appropriate terminals in the meter test switch.

Another unique aspect of the present invention is also shown in FIG. 3 and includes an aperture 36 in the rim filler 20. The aperture 36 is shown by way of example only as being along the longitudinal center line of the meter socket 10 and extends completely through the filler 20 and the lower portion of the sidewall 14.

The aperture 36 allows any cables or conductors, such as data or telephone cables, extending out of the back of a watthour meter socket adapter to pass easily through the filler 20 in the meter socket 10 without sharp bends or elaborate routing through the lower portion of the meter socket 10. This arrangement allows such cables to lie in a natural curve or bend between the lower sidewalls 18 of the meter socket 10 and enables such conductors to pass exteriorly of the meter socket 10 for connection to the respective device or circuit.

In FIG. 4, the cross-hatched area depicts a sidewall of the filler 20 formed by removal of a portion of the filler 20 to form an aperture 36. This shape results from the conventional formation of a rib along the vertical center line of the filler 20.

In FIG. 5 there is depicted another aspect of the present invention wherein a meter socket 40 is constructed essentially similar to the meter socket 10, with like components being given the same reference number as like components in the meter socket 10. Thus, the meter socket 40 includes a base wall 12, an annular sidewall 14, a mounting flange 16, lower walls 18, and rim filler 20. According to this aspect to the meter socket 40, the aperture 36 is formed in the filler 20 for passage of data cables or telephone cables from a watthour meter mounted on the mounting flange 16 through the meter socket 40. The meter socket 40 also includes the same contacts and conductors 30 as in the meter socket 10. The conductors 30 are also provided in two bundles or groups 32 and 34.

The main difference between the meter socket 40 and the meter socket 10 is that the lower walls 18 of the meter socket 40 terminate at a shorter length from the lowermost portion of the annular sidewall 14 than in the meter socket 10. Essentially, the lower walls 18 do not include a lower end portion which would include the aperture 20 and which would normally be used for mounting of a terminal block in a conventional meter socket.

FIG. 6 depicts yet another meter socket 50 which is essentially identical to the meter socket 40 shown in FIG. 5 and described above with one exception.

In this aspect of the invention, the meter socket 50 does not include any aperture corresponding to the aperture 36 in the filler 20 as in the meter sockets 10 and 40. In FIG. 6, the conventional rib 52 centered on the filler 20 extends between the annular sidewall 14 and a ridge or projection formed on a lower portion of the filler 20.

It will be understood that the meter socket 10, although described above as including the aperture 36 for receiving conductors extending from a watthour meter, may be formed without the aperture 36 in the same manner as shown in FIG. 6.

In use, any of the meter sockets 10, 40, or 50 are constructed in the manner described above with the conductors 30 extending individually or in multiple groups, such as two groups or bundles 32 and 34, from a lower open end of each meter socket 10, 40, or 50.

The meter socket 10, 40, or 50 is then mounted in a conventional socket enclosure by means of fasteners or hangers attachable to the base wall 12 of each meter socket and one wall, such as a back wall, of the socket enclosure.

A separate meter test switch is also mounted in the socket enclosure at a location spaced from the lower portion of the meter socket 10, 40, or 50. The individual conductors 30 are connected to the appropriate terminals on the meter test switch by means of the color coding format of the present invention.

The provision of a meter socket having conductors of an extended length connected at one to the jaws in the meter socket and extending outward from an open end of the meter socket for connection to a remotely located meter test switch simplifies the mounting and use of new and/or existing meter test switches with the inventive meter socket. The conductors passing out of the meter socket are color coded for connection to appropriate meter test switch terminals thereby simplifying the interconnection of the meter socket and the meter test switch. The unique provision of an aperture in the filler portion of the meter socket facilitates the passage of auxiliary cables or conductors from a watthour meter mounted on the meter socket through the interior of the meter socket for connection to an external device or circuit.

What is claimed is:

1. A watthour meter socket for connection to a watthour meter test switch, the meter socket comprising:
    a housing having a base and a sidewall extending from the base, the sidewall having a mounting flange extending radially outward from one end of at least a portion of the sidewall for interconnection with a mating mounting flange on a watthour meter;
    jaws mounted on the base of the housing for receiving blade terminals of a watthour meter; and
    flexible electrical conductors, each connected at one end to each of the jaws and extending unitarily externally from the housing to another end, the another end of each conductor adapted to be directly connected to a remotely located meter test switch.

2. The meter socket of claim 1 wherein the conductors extending from the housing of the meter socket are arranged in at least one group.

3. The meter socket of claim 1 wherein the conductors extending from the housing of the meter socket have unique exterior color coding to identify each specific conductor.

4. The meter socket of claim 1 further comprising:
    lower walls projecting from a portion of the annular sidewall of the; and
    a rim filler extending from the annular sidewall and across the lower walls.

5. The watthour meter socket of claim 1 wherein:
    the electrical conductors are bundable.

6. The meter socket of claim 2 wherein the conductors are arranged in at least two groups.

7. The meter socket of claim 4 wherein:
    the base and two opposed walls project axially from the rim filler and forming an open end at one end of the housing, the electrical conductors passing through the open end of the housing.

8. A watthour meter socket for connection to a watthour meter test switch, the meter socket comprising:
    a housing having a base and a sidewall extending from the base, the sidewall having a mounting flange extending radially outward from one end of at least a portion of the sidewall for interconnection with a mating mounting flange on a watthour meter;
    jaws mounted on the base of the housing for receiving blade terminals of a watthour meter;
    electrical conductors, each connected at one end to each of the jaws and extending externally from the housing to another end, the another end of each conductor adapted to be directly connected to a remotely located meter test switch;
    lower walls projecting from a portion of the annula sidewall of the housing;
    a rim filler extending from the annular sidewall and across the lower walls; and
    an aperture formed through the rim filler and the mounting flange adapted for passage of electrical conductors from a watthour meter therethrough when a watthour meter is mounted on the mounting flange on the housing.

9. A watthour meter socket for connection to a watthour meter test switch, the meter socket comprising:
    a housing having a base and a sidewall extending from the base, the sidewall having a mounting flange extending radially outward from one end of at least a portion of the sidewall for interconnection with a mating mounting flange on a watthour meter;
    jaws mounted on the base of the housing for receiving blade terminals of a watthour meter;
    electrical conductors, each connected at one end to each of the jaws and extending externally from the housing to another end, the another end of each conductor adapted to be directly connected to a remotely located meter test switch;
    lower walls projecting from a portion of the annular sidewall of the housing;
    a rim filler extending from the annular sidewall and across the lower walls;
    an aperture formed through the rim filler and the mounting flange adapted for passage of electrical conductors from a watthour meter therethrough when a watthour meter is mounted on the mounting flange on the housing; and
    an aperture formed through the rim filler and an adjacent portion of the sidewall adapted for passage of electrical conductors from a watthour meter therethrough and through the open end of the housing when a watthour meter is mounted on the mounting flange on the housing.

10. A watthour meter socket adapter for connection to a watthour meter, the meter socket comprising:
    a housing having a base and a sidewall extending from the base, the sidewall having a mounting flange extending radially outward from one end of at least a portion of the sidewall for interconnection with a mating mounting flange on a watthour meter;
    jaw contacts mounted on the base of the housing for receiving blade terminals of a watthour meter; and
    flexible electrical conductors, each connected at one end to each of the jaw contacts and extending unitarily externally from the housing to another end.

11. The meter socket of claim 10 wherein the conductors extending from the housing of the meter socket are arranged in at least one group.

12. The meter socket of claim 10 wherein the conductors extending from the housing of the meter socket have unique exterior color coding to identify each specific conductor.

13. The meter socket of claim 10 further comprising:
    lower walls projecting from a portion of the annular sidewall of the; and
    a rim filler extending from the annular sidewall and across the lower walls.

14. The watthour meter socket adapter of claim 10 wherein:
    the electrical conductors are bundable.

15. The meter socket of claim 11 wherein the conductors are arranged in at least two groups.

16. The meter socket of claim 13 wherein:
    the base and two opposed walls project axially from the rim filler and forming an open end at one end of the housing, the electrical conductors passing through the open end of the housing.

17. A meter socket adapter for connection to a watthour meter, the meter socket comprising:

a housing having a base and a sidewall extending from the base, the sidewall having a mounting flange extending radially outward from one end of at least a portion of the sidewall for interconnection with a mating mounting flange on a watthour meter;

jaws mounted on the base of the housing for receiving blade terminals of a watthour meter;

electrical conductors, each connected at one end to each of the jaws and extending unitarily externally from the housing to another end, the another end of each conductor adapted to be directly connected to a remotely located meter test switch;

lower walls projecting from a portion of the annular sidewall of the housing;

a rim filler extending from the annular sidewall and across the lower walls and;

an aperture formed through the rim filler and the mounting flange adapted for passage of electrical conductors from a watthour meter therethrough when a watthour meter is mounted on the mounting flange on the housing.

18. A meter socket adapter for connection to a watthour meter, the meter socket adapter comprising:

a housing having a base and a sidewall extending from the base, the sidewall having a mounting flange extending radially outward from one end of at least a portion of the sidewall for interconnection with a mating mounting flange on a watthour meter;

jaws mounted on the base of the housing for receiving blade terminals of a watthour meter;

electrical conductors, each connected at one end to each of the jaws and extending unitarily externally from the housing to another end, the another end of each conductor adapted to be directly connected to a remotely located meter test switch;

lower walls projecting from a portion of the annular sidewall of the housing;

a rim filler extending from the annular sidewall and across the lower walls;

the base and two opposed walls projecting axially from the rim filler and forming an open end at one end of the housing, the electrical conductors passing through the open end of the housing; and an aperture formed through the rim filler and an adjacent portion of the sidewall adapted for passage of electrical conductors from a watthour meter therethrough and through the open end of the housing when a watthour meter is mounted on the mounting flange on the housing.

19. An electrical power service apparatus comprising:

a watthour meter socket including:

a housing having a base and a sidewall extending from the base, the sidewall having a mounting flange extending radially outward from one end of at least a portion of the sidewall for interconnection with a mating mounting flange on a watthour meter;

jaws mounted on the base of the housing for receiving blade terminals of a watthour meter;

flexible electrical conductors, each connected at one end to each of the jaws and extending unitarily externally from the housing to another end;

a plurality of instrument transformers, each having electrical leads extending therefrom; and means for connecting the another ends of the electrical conductors to the instrument transformers.

20. The apparatus of claim 19 wherein the means for connecting the another ends of the electrical conductors to the instrument transformers comprises:

a plurality of meter test switches, each test switch having terminals for receiving the another end of one of the electrical conductors and one electrical lead on one instrument transformer.

\* \* \* \* \*